(12) United States Patent
AbdelAzim et al.

(10) Patent No.: US 8,898,607 B2
(45) Date of Patent: Nov. 25, 2014

(54) METHOD AND SYSTEM FOR USING A BREADBOARD

(71) Applicant: Integreight, Inc., Dover, DE (US)

(72) Inventors: Amr Nasr ElDin AbdelAzim, Helwan (EG); Amr Ahmed Elsayed Mohamed Saleh, Cairo (EG); Mohamed Sami Ali Hassan, Cairo (EG); Mohamed Nashat Salman Ahmed, Helwan (EG); Islam Mohamed Mostafa Ahmed Mostafa, Cairo (EG); Ramy Ali Ibrahim, Helwan (EG); Ahmed Mohamed AbdelHamid Mohamed Metwally, Cairo (EG); Ahmed Mohamed Fahmy Abdel Aziz, Cairo (EG); Mahmoud Mohamed Attia ElMesalawy, Cairo (EG)

(73) Assignee: Integreight, Inc., Dover, DE (US)

( * ) Notice: Subject to any disclaimer, the term of this patent is extended or adjusted under 35 U.S.C. 154(b) by 0 days.

(21) Appl. No.: 14/074,377

(22) Filed: Nov. 7, 2013

(65) Prior Publication Data
US 2014/0130002 A1    May 8, 2014

Related U.S. Application Data

(60) Provisional application No. 61/723,398, filed on Nov. 7, 2012.

(51) Int. Cl.
*G06F 17/50*    (2006.01)
*G06F 9/455*    (2006.01)

(52) U.S. Cl.
CPC .................... *G06F 17/5068* (2013.01)
USPC ............... 716/112; 716/111; 716/136

(58) Field of Classification Search
USPC ......................... 716/111, 112, 136
See application file for complete search history.

(56) References Cited

U.S. PATENT DOCUMENTS

| | | | |
|---|---|---|---|
| 4,779,340 A | | 10/1988 | Kihm et al. |
| 5,043,910 A | * | 8/1991 | Chiba ........................ 716/136 |
| 5,325,309 A | * | 6/1994 | Halaviati et al. ............. 703/15 |
| 5,329,470 A | * | 7/1994 | Sample et al. ............... 703/28 |
| 5,339,219 A | | 8/1994 | Urich |
| 5,339,262 A | * | 8/1994 | Rostoker et al. ............. 716/136 |
| 5,625,780 A | | 4/1997 | Hsieh et al. |
| 5,654,564 A | | 8/1997 | Mohsen |

(Continued)

OTHER PUBLICATIONS

Mitchell Cottrell "Breadboarding guide" Nov. 15, 2001.*

(Continued)

*Primary Examiner* — Vuthe Siek
*Assistant Examiner* — Brian Ngo
(74) *Attorney, Agent, or Firm* — Osha • Liang LLP

(57) ABSTRACT

A method for using a breadboard involves receiving a circuit wiring connection layout, in which the circuit wiring connection layout includes a visual representation of circuit elements. The method further involves sending, to the breadboard, the circuit wiring connection layout, receiving a selection of a circuit element from the circuit elements to obtain a selected circuit element, sending, to the breadboard and based on the selected circuit element, a signal to activate an alert device on the breadboard indicating where a user should place the selected circuit element on the breadboard, receiving a circuit characteristic to measure from the selected circuit element, sending, to the breadboard, the circuit characteristic to measure from the selected circuit element, receiving, from the breadboard, a measurement of the circuit characteristic to obtain a measured circuit characteristic, and displaying the measured circuit characteristic.

20 Claims, 13 Drawing Sheets

(56) References Cited

U.S. PATENT DOCUMENTS

| | | | |
|---|---|---|---|
| 5,917,229 | A | 6/1999 | Nathan et al. |
| 6,449,167 | B1 | 9/2002 | Seymour |
| 6,895,563 | B2 * | 5/2005 | Dixon et al. ............ 716/136 |
| 6,964,574 | B2 | 11/2005 | Pavesi et al. |
| 7,292,046 | B2 * | 11/2007 | Buheis et al. ............ 324/537 |
| 2004/0096812 | A1 | 5/2004 | Goh et al. |
| 2008/0233768 | A1 | 9/2008 | Joshi et al. |
| 2008/0270951 | A1 * | 10/2008 | Anand et al. ............ 716/4 |
| 2009/0150839 | A1 * | 6/2009 | Huang et al. ............ 716/5 |

OTHER PUBLICATIONS

"Teach Analog Circuits with NI Multisim and NI ELVIS"; National Instruments; Retrieved at http:/www.ni.com/white-paper/13599/en/; Published Mar. 12, 2013. (18 pages).

Radu, M.; "Use of Electronics Explorer Board in Electrical Engineering Education"; American Society for Engineering Education; Jun. 28, 2011. (12 pages).

Millard, D. et al.; "The Mobile Electronics Studio at Rensselaer: Next Generation Engineering Education"; Retrieved from http://www.cs.cornell.edu/conferences/asee2006/ASEE%20Papers/Session%205/Mobile%20Studio%20Paper%20ASEE%20STLaw06_Smith.pdf; Jan. 2006 (5 pages).

"Multimedia Lab for Exploring Electricity and Electronics"; Edison Electricity & Electronics Educational Software; Retrieved from http:/www.designwareinc.com/edison.html; Dec. 12, 2012. (5 pages).

"LPC2138 Education Board User's Guide"; Embedded Artists; Malmo, Sweden; May 25, 2009; (41 pages).

* cited by examiner

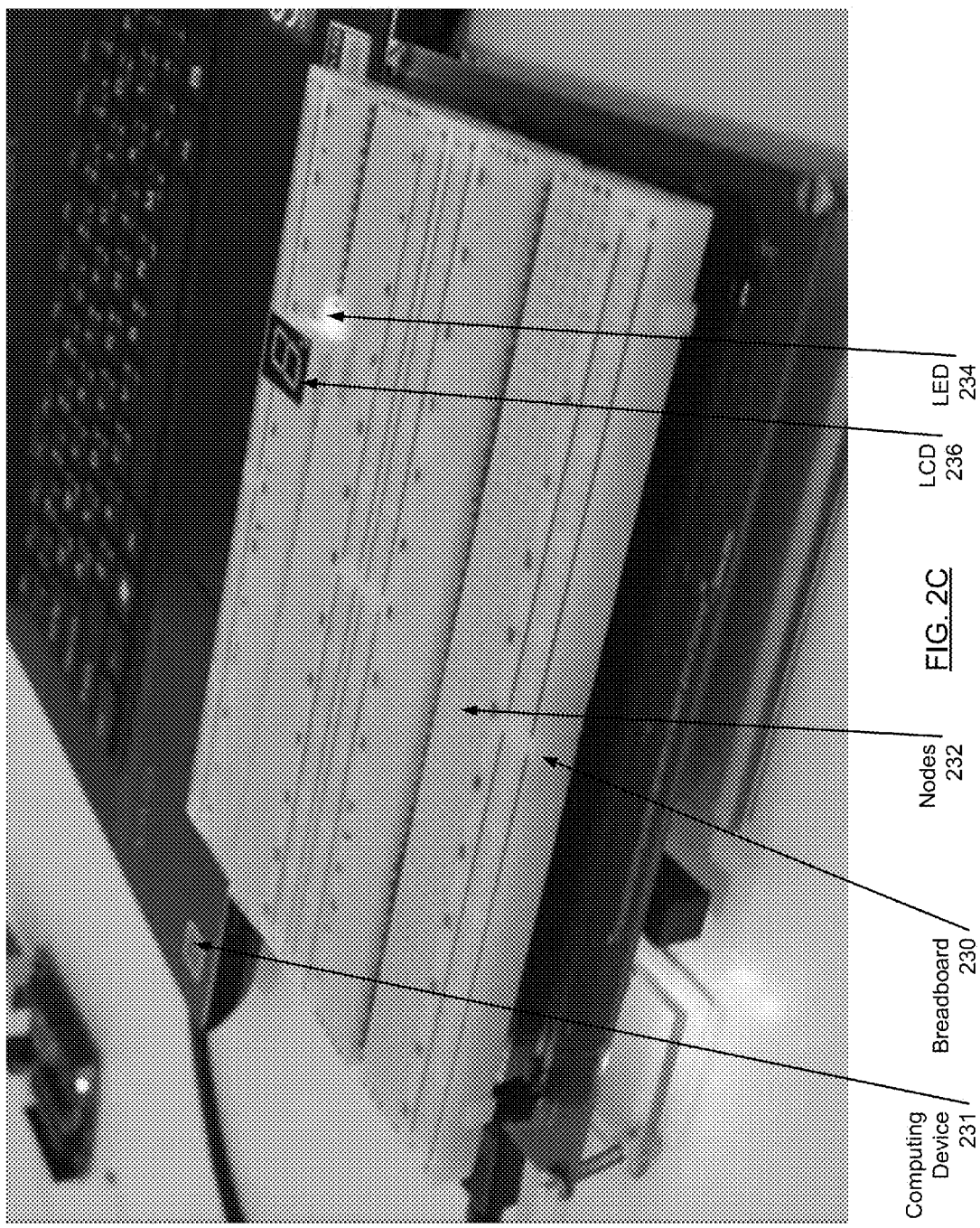

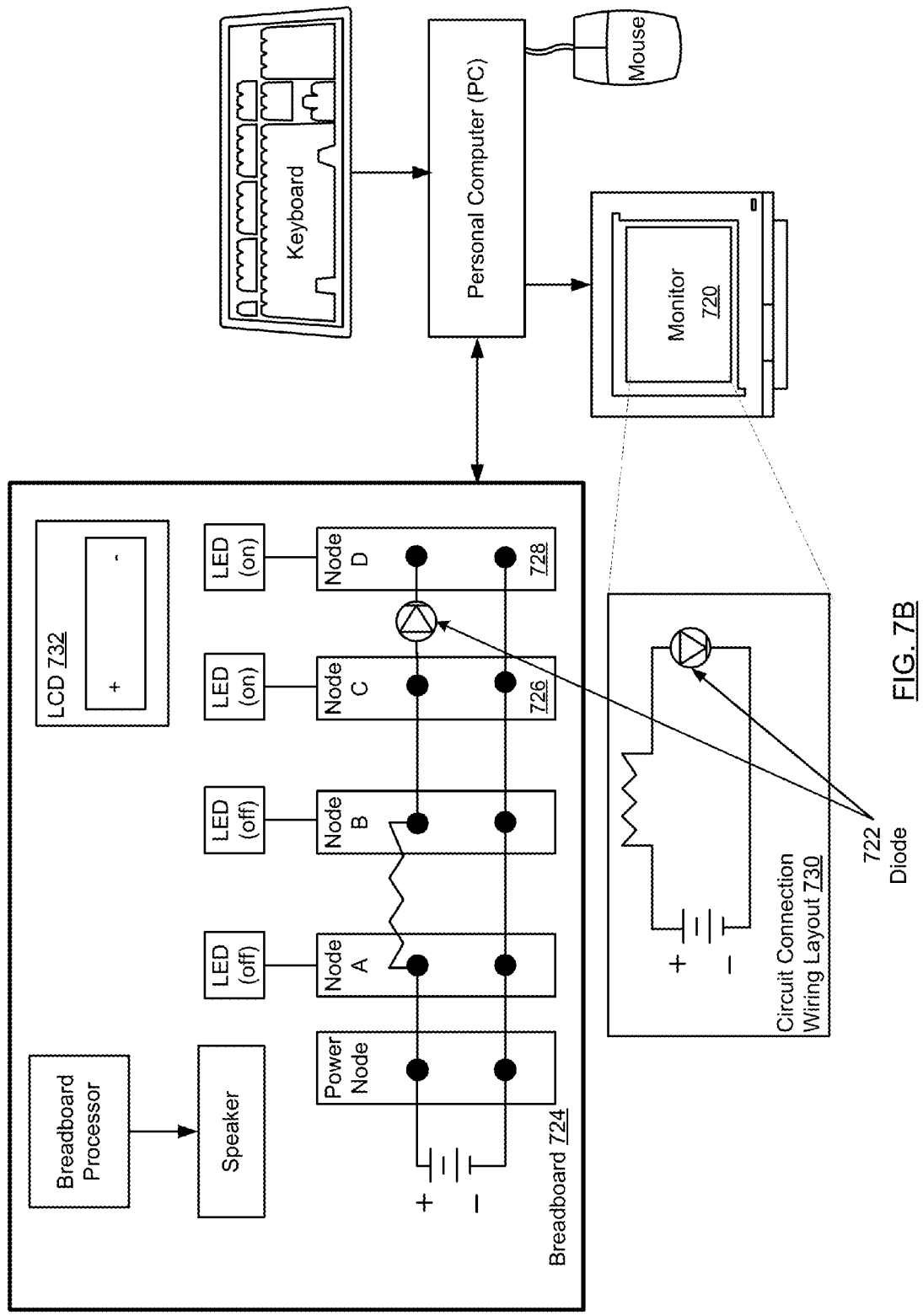

METHOD AND SYSTEM FOR USING A BREADBOARD

CROSS-REFERENCE TO RELATED APPLICATIONS

This application claims the benefit under 35 U.S.C. §119(e) of U.S. Provisional Application No. 61/723,398, filed on Nov. 7, 2012, which is hereby incorporated by reference.

BACKGROUND

In general, a breadboard is used as a foundation to prototype a circuit. Specifically, a breadboard provides the apparatus to connect various circuit elements and power sources together. Often, in order to test the circuit, several external test instruments are connected to the circuit in order to determine a circuit characteristic such as voltage at a particular point in the circuit. Further, often times a circuit is incorrectly wired when using a breadboard, leading to a malfunctioning circuit.

SUMMARY

In general, in one aspect, the invention relates to a method for using a breadboard includes receiving a circuit wiring connection layout, in which the circuit wiring connection layout includes a visual representation of circuit elements. The method further includes sending, to the breadboard, the circuit wiring connection layout, receiving a selection of a circuit element from the circuit elements to obtain a selected circuit element, sending, to the breadboard and based on the selected circuit element, a signal to activate an alert device on the breadboard indicating where a user should place the selected circuit element on the breadboard, receiving a circuit characteristic to measure from the selected circuit element, sending, to the breadboard, the circuit characteristic to measure from the selected circuit element, receiving, from the breadboard, a measurement of the circuit characteristic to obtain a measured circuit characteristic, and displaying the measured circuit characteristic.

In general, in one aspect, the invention relates to a method for using a breadboard includes receiving a circuit wiring connection layout, in which the circuit wiring connection layout includes a visual representation of circuit elements. The method further includes connecting, based on the circuit wiring connection layout, nodes, in which the breadboard includes nodes and an alert device connected to the nodes. Further, the method includes receiving a signal to activate the alert device indicating where a user should place a circuit element from the circuit elements on the breadboard, activating, based on the signal, the alert device, receiving a circuit characteristic to measure from the circuit element, measuring, using a test instrument, the circuit characteristic from the circuit element to obtain a measured circuit characteristic, and sending the measured circuit characteristic.

In general, in one aspect, the invention relates to a system including a breadboard, an output device, an input device, and a computing device. The breadboard includes nodes and an alert device connected to the nodes. The computing device is operatively connected to the output device and the input device, communicatively coupled to the breadboard, and includes a device processor configured to receive a circuit wiring connection layout, in which the circuit wiring connection layout includes a visual representation of circuit elements. The computing device is further configured to send, to the breadboard, the circuit wiring connection layout, receive a selection of a circuit element from the circuit elements to obtain a selected circuit element, send, to the breadboard and based on the selected circuit element, a signal to activate an alert device on the breadboard indicating where a user should place the selected circuit element on the breadboard, receive a circuit characteristic to measure from the selected circuit element, send, to the breadboard, the circuit characteristic to measure from the selected circuit element, receive, from the breadboard, a measurement of the circuit characteristic to obtain a measured circuit characteristic, and display the measured circuit characteristic.

In general, in one aspect, the invention relates to a non-transitory computer-readable storage medium storing instructions. The instructions include functionality to receive a circuit wiring connection layout, in which the circuit wiring connection layout includes a visual representation of circuit elements. The instructions further include functionality to send, to the breadboard, the circuit wiring connection layout, receive a selection of a circuit element from the circuit elements to obtain a selected circuit element, send, to the breadboard and based on the selected circuit element, a signal to activate an alert device on the breadboard indicating where a user should place the selected circuit element on the breadboard, receive a circuit characteristic to measure from the selected circuit element, send, to the breadboard, the circuit characteristic to measure from the selected circuit element, receive, from the breadboard, a measurement of the circuit characteristic to obtain a measured circuit characteristic, and display the measured circuit characteristic.

Other aspects and advantages of the invention will be apparent from the following description and the appended claims.

BRIEF DESCRIPTION OF DRAWINGS

FIG. 2C shows an image of the system in accordance with one or more embodiments of the invention.

FIGS. 7A, 7B, 7C, and 7D show an example in accordance with one or more embodiments of the invention.

DETAILED DESCRIPTION

Figure 1:
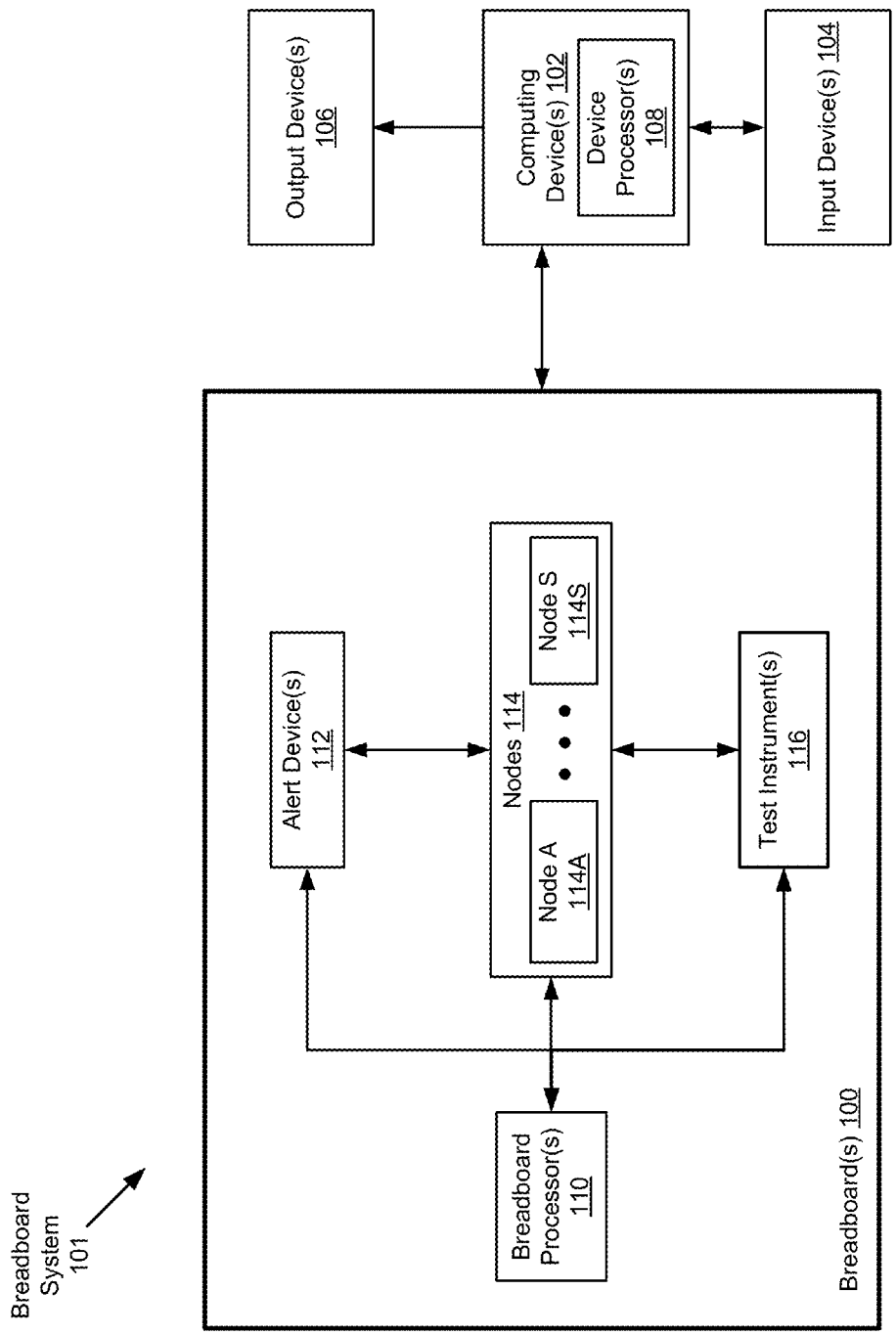
FIG. 1 shows a schematic diagram of a system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a method and system for using a breadboard. Specifically, embodiments of the invention direct the user of circuit element placement on the breadboard and perform measurements on the circuit using integrated test instruments.

FIG. 1 shows a schematic diagram of a breadboard system in accordance with one or more embodiments of the invention. In general, in accordance with one or more embodiments of the invention, the computing device(s) (102) works in conjunction with the breadboard(s) (100) to direct placement of circuit elements (not shown) on the breadboard(s) (100) using alert device(s) (112), collect measurements from the circuit using one or more test instrument(s) (116), and display circuit measurements on the computing device(s) (102) using a graphical user interface (not shown). The components and functionality of the computing device(s) (102) are similar to those shown and described in relation to FIG. 8 below.

As used herein, a circuit element is any physical component that is used to affect the movement of electrons. The circuit element includes one or more terminals to connect to other circuit elements. For example, the circuit element may be a resistor, capacitor, inductor, transistor, diode, integrated circuit, switch, operational amplifier, voltage source, current source, or any other electronic component. In one or more embodiments of the invention, various circuit elements are connected in parallel or series.

As used herein, a circuit connection wiring layout is a representation of circuit elements and connections in a circuit. In one or more embodiments of the invention, the circuit connection wiring layout visually represents circuit elements using symbols and indicates connections between circuit elements using lines. In one or more embodiments of the invention, the circuit connection wiring layout represents the circuit elements and connections between circuit elements in an encoded format such as a table. In one or more embodiments of the invention, the circuit connection wiring layout is formatted to be exported to another device. For example, the circuit connection wiring layout may represent the circuit in tabular form by listing the circuit elements and each circuit element's connections. Further, the tabular representation of the circuit may be created in a spreadsheet and exported to another device.

As used herein, a circuit characteristic is a measurable characteristic of a circuit taken across two points in a circuit. Specifically, the circuit characteristic describes, in various forms, the movement of electrons through a circuit. Circuit characteristics include, for example, resistance, voltage, current, impedance, capacitance, power consumption, frequency, circuit gain/loss, and any other measurable characteristic of a circuit. For example, the circuit characteristic may be voltage, which is the difference in electric potential between two points in a circuit.

As shown FIG. 1, the breadboard system (101) includes one or more computing device(s) (102) and one or more breadboard(s) (100) in accordance with one or more embodiments of the invention. Each component and subcomponent is described below.

In one or more embodiments of the invention, the computing device(s) (102) and breadboard(s) (100) are used in an educational setting where many combinations of computing device(s) (102) and breadboard(s) (100) are possible. For example, a single computing device may be connected to a single breadboard or a single computing device may be connected to multiple breadboards or multiple computing devices may be connected to a single breadboard. Of course, other possible configurations may be possible.

In one or more embodiments, the computing device(s) (102) may be one or more mobile devices including a laptop computer, tablet computer, smart phone, personal digital assistant, or other mobile device. Further, the computer device(s) (102) may also be one or more desktop computers, servers, blades in a server chassis, or any other type of computing device or devices that includes at least the minimum processing power and memory to perform one or more embodiments of the invention.

In one or more embodiments, the computing device(s) (102) includes one or more device processor(s) (108) and is operatively connected to one or more input device(s) (104) and one or more output device(s) (106). Each of these components is discussed below.

In one or more embodiments of the invention, the device processor(s) (120) are an integrated circuit or other device configured to process instructions. For example, the device processor(s) (108) may be one or more cores, or micro-cores of a processor.

In one or more embodiments of the invention, the input device(s) (104) are any device(s) that gathers input, indirectly or directly, from a user. The computing devices(s) (102) may include one or more input device(s) (104), such as a touchscreen, keyboard, mouse, microphone, touchpad, electronic pen, joystick, scanner, digital camera, or any other type of input device.

In one or more embodiments of the invention, the output device(s) (106) are any device that displays information in a human-readable format. The computing device(s) (102) may include one or more output device(s) (106), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s).

In one or more embodiments of the invention, the computing device(s) (102) are connected to a network (e.g., a local area network (LAN), a wide area network (WAN) such as the Internet, mobile network, or any other type of network) via a network interface connection (not shown). The input device(s) (104) and output device(s) (106) may be locally or remotely (e.g., via the network) connected to the device processor(s) (108).

The computing device(s) (102) are communicatively coupled to the breadboard(s) (100) in accordance with one or more embodiments of the invention. The breadboard(s) (100) includes one or more breadboard processor(s) (110) connected to a set of nodes (114), alert device(s) (112), and test instrument(s) (116). Specifically, the breadboard(s) (100) are boards with a set of nodes that may be connected to each other. Each of these components is described below. In one or more embodiments of the invention, the breadboard(s) (100) are solderless and connect circuit elements via other mechanical means. In one or more embodiments of the invention, the breadboard(s) (100) connect elements using solder. Further, the breadboard(s) may be a combination of soldered and solderless connections between circuit elements.

In one or more embodiments of the invention, the breadboard processor(s) (110) are integrated circuits or other devices configured to process instructions. For example, the breadboard processor(s) may be one or more cores, or micro-cores of a processor.

In one or more embodiments of the invention, the set of nodes (114) is operatively connected alert device(s) (112) and test instrument(s) (116). Each node (114A, 114S) is a row of holes on the breadboard that are connected by a metal strip. Specifically, each node in the breadboard denotes, in terms of a circuit wiring connection layout, a point where two or more components connect. For example, if a circuit wiring connection layout included two resistors in parallel connected to a battery, the point at which the two resistors connect with the battery is a node. Implemented on a breadboard, one terminal of each resistor and one terminal of the battery are connected into the same node.

In one or more embodiments of the invention, the alert device(s) (112) are any device that is used to notify the user of the placement of a circuit element on the breadboard. Specifically, the alert device(s) (112) guide the user on which nodes to place the circuit element. The alert device(s) (112) may be a speaker, LCD, Light Emitting Diodes (LEDs) or other device with functionality to alert the user. In one or more embodiments of the invention, each alert device is assigned a unique identifier to be used by the computing device(s) (102) and breadboard(s) (100). For example, the alert device(s) (112) may include an LED connected to each node (114A, 114S) of the breadboard(s) (100). When the user selects a circuit element to place on the circuit, the LED connected to the corresponding nodes light up.

In one or more embodiments of the invention, test instrument(s) (116) are any instruments used to measure a circuit characteristic. Specifically, the test instrument(s) (116) probe one or more points in a circuit to measure a given circuit characteristic. In one or more embodiments of the invention, the test instrument(s) (116) are implemented in hardware, software, firmware, or a combination thereof. In one or more embodiments of the invention, additional test instrument(s) (116) are externally attached. In one or more embodiments of the invention, the test instrument(s) (116) are coupled with a power source to produce signals to pass through the circuit. Further, the test instrument(s) (116) may be a multi-meter, an oscilloscope, a signal analyzer capable of measuring voltage and current, or any testing or measurement tool. For example, if the test instrument in one embodiment is a multi-meter, the multi-meter measures the voltage across a resistor in a circuit including a resistor and diode.

In one or more embodiments of the invention, the power source(s) (not shown) are any instruments used to supply power to a circuit. In one or more embodiments of the invention, the power source(s) (not shown) are implemented in hardware, software, firmware, or a combination thereof. In one or more embodiments of the invention, additional power source(s) (not shown) are externally attached. In one or more embodiments of the invention, as discussed above, the power source(s) (not shown) are coupled with a test instrument(s) (116) to produce signals to pass through the circuit. Further, the power source(s) (not shown) may be an AC/DC voltage source, AC/DC current source, function generator, or any instrument capable of supplying power. For example, if the test instrument in one embodiment is an oscilloscope, the oscilloscope measures the response of a circuit to a sinusoidal waveform generated by a function generator.

Figure 2A:
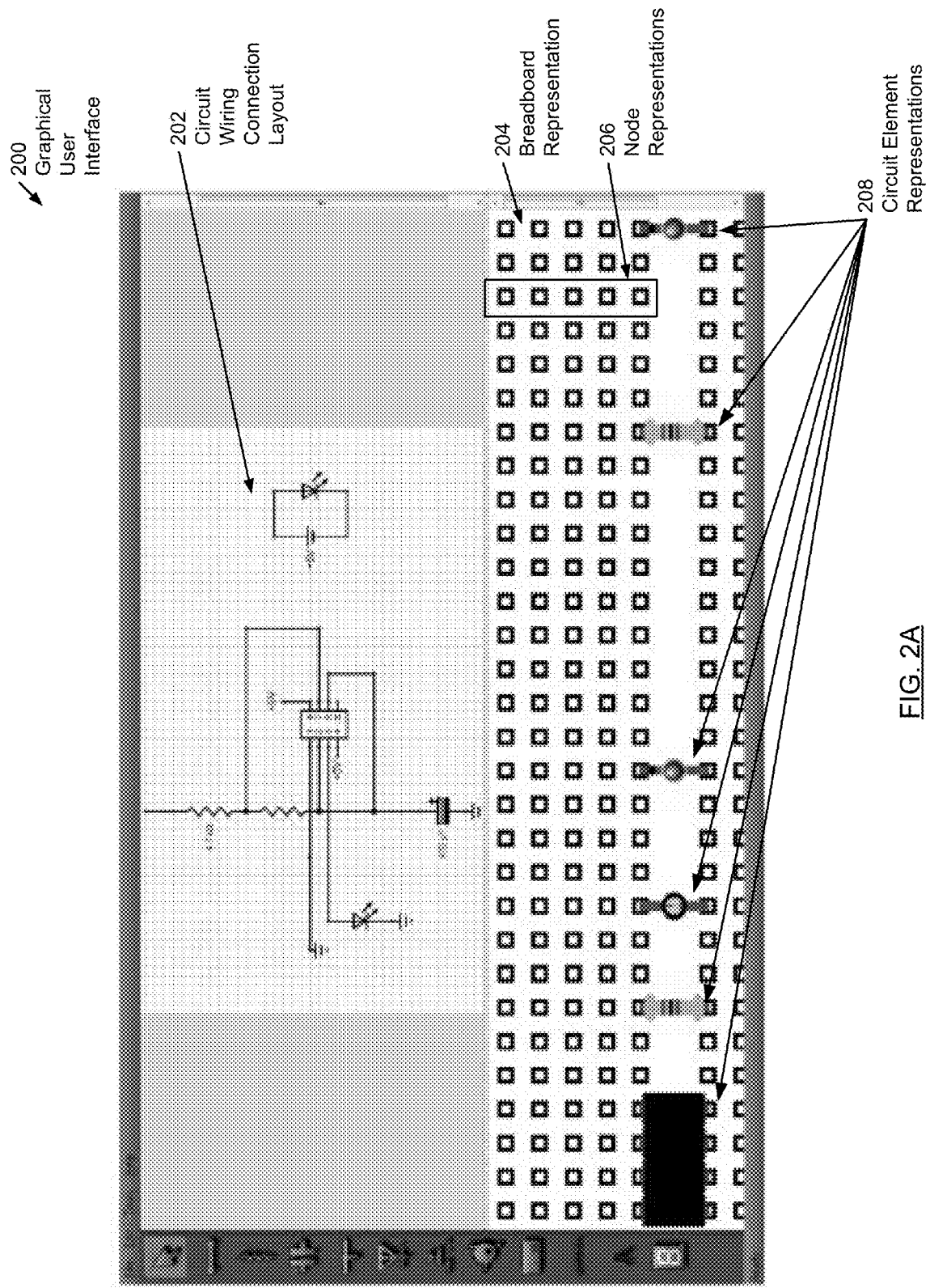
FIGS. 2A and 2B show screenshots of the system in accordance with one or more embodiments of the invention.
Figure 2B:
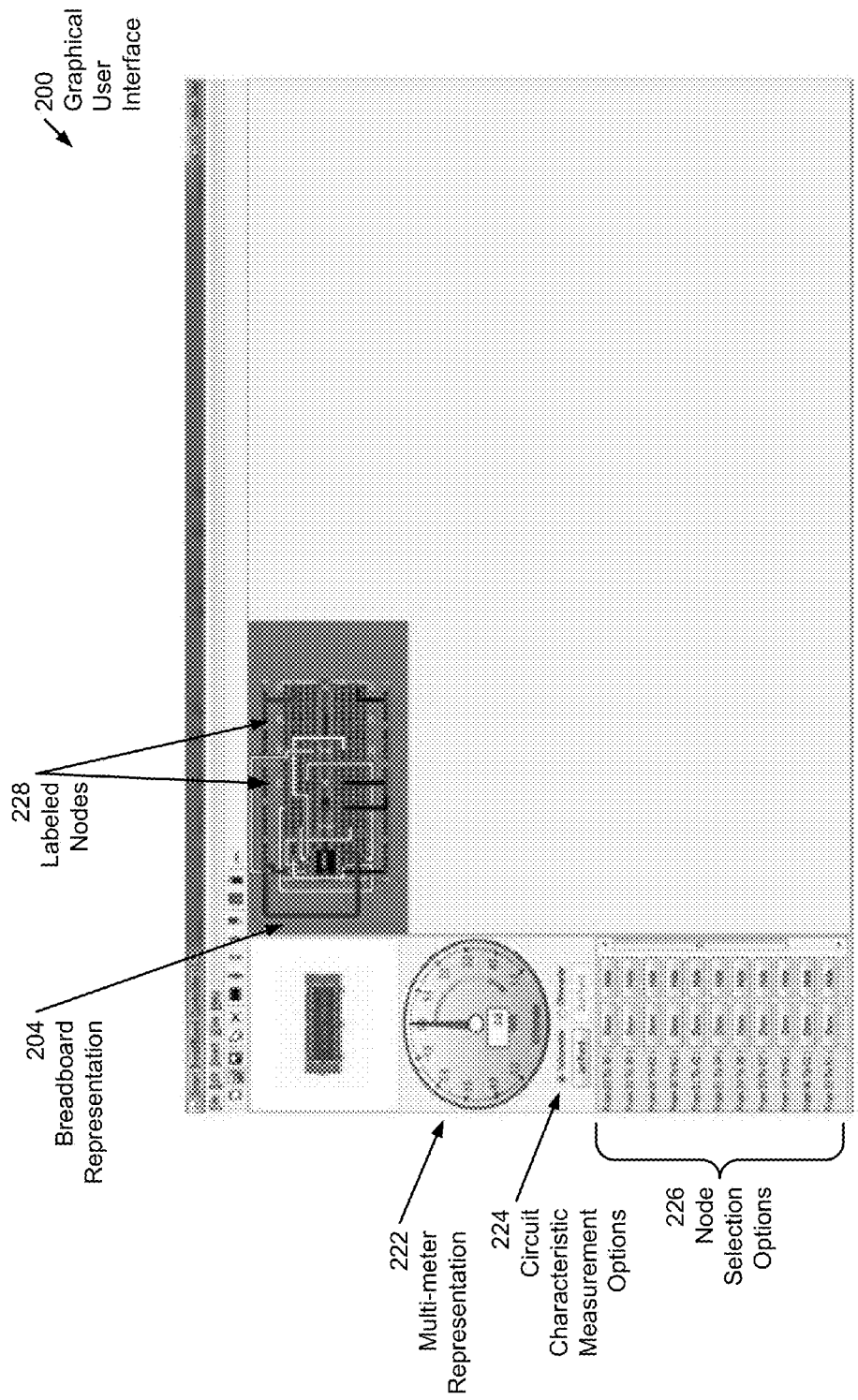

FIGS. 2A and 2B show screenshots in accordance with one or more embodiments of the invention. While various designs of the user interface are presented and described, one of ordinary skill will appreciate that some or all of the interface design layout features may be different.

FIG. 2A shows a screenshot of a circuit wiring connection layout (202), as designed by a user via a graphical user interface (200). The graphical user interface (200) is displayed by an output device (not shown) as described as output device(s) (106) connected to the computing device(s) (102) in FIG. 1. The user may interact with the graphical user interface (200) using an input device (not shown) as described as input device(s) (104) connected to the computing device(s) (102) in FIG. 1.

Continuing with FIG. 2A, in one or more embodiments of the invention, the circuit wiring connection layout (202) is user-drawn and includes symbols to represent circuit elements and lines to represent the connections between circuit elements. Specifically, the graphical user interface (200) provides symbols and connection tools for the user to draw a circuit wiring connection layout. In one or more embodiments of the invention, the circuit elements in the circuit wiring connection layout are be represented by pictures, text, or user-created symbols.

In one or more embodiments of the invention, a breadboard representation (204) is the graphical representation of the circuit element representations (208) connected to node representations (206) on a specific breadboard. Each of these components is described below. Specifically, the graphical user interface (200) shows the circuit element representations (208) connected via node representations (206) as determined by the user-drawn circuit wiring connection layout (202). In one or more embodiments of the invention, the breadboard representation (204) includes the wiring between nodes, as is shown in FIG. 2B. Further, the breadboard representation (204) may include a color-coding scheme to distinguish connections to power sources, ground, and other circuit elements.

In one or more embodiments of the invention, the breadboard representation (204) includes circuit element representations (208). Specifically, the breadboard representation (204) includes one of the circuit element representations (208) for each circuit element symbol in the circuit wiring connection layout. In one or more embodiments of the invention, the circuit element representation (208) is repositioned to connect to another node on the breadboard, affecting the positions of remaining circuit elements according to the circuit wiring connection layout. In one or more embodiments of the invention, the circuit elements are represented by pictures or user-created visual representations.

In one or more embodiments of the invention, a node representation (206) in the breadboard representation (204) includes connection holes to connect circuit elements (208) to the node. Specifically, the connection holes of a node represent a connection point between the node and a circuit element. In one or more embodiments of the invention, the node (206) includes any number of connection holes. In one or more embodiments of the invention, the user configures the number of connection holes in a node via the graphical user interface (200). In one or more embodiments of the invention, the breadboard representation includes nodes as configured by the user.

In one or more embodiments of the invention, a circuit wiring connection layout may be designed by a user via the graphical user interface (200). The graphical user interface (200) is displayed by one or more output device(s) as described in FIG. 1. The user may interact with the graphical user interface (200) using one or more input device(s) as described in FIG. 1.

FIG. 2B shows a screenshot of a graphical user interface (200) for using a multi-meter. In one or more embodiments of the invention, a multi-meter is selected as a test instrument (from an assortment of testing instruments) to test the circuit via the graphical user interface (200).

In one or more embodiments of the invention, the breadboard representation (204) includes circuit element representations and labeled nodes (228). On the breadboard representation (204), each node representation is labeled with a number as shown in FIG. 2B. Specifically, the labeled nodes (228) denote potential connection points in the circuit to be tested. In one or more embodiments of the invention, the graphical user interface (200) includes, in the same screen, the circuit wiring connection layout (not shown) with corresponding labeled connection points. Further, if the user selects a connection point on the circuit wiring connection layout, the corresponding connection point on the breadboard representation (204) is also selected. For example, the graphical user interface (200) includes the circuit wiring connection layout from FIG. 2A with each of the nodes assigned a number according to the corresponding labeled node from the labeled nodes (228) on the breadboard representation (204).

In one or more embodiments of the invention, the multi-meter representation (222) includes circuit characteristic measurement options (224) and node selection options (226). Specifically, the user configures the multi-meter presentation (222) by selecting circuit characteristic measurement options (224) and node selection options (226) via the graphical user interface (200). Each of these components is described below.

In one or more embodiments of the invention, the circuit characteristic measurement options (224) are parameters the user may select within the graphical user interface (200) to configure a given test instrument. Specifically, the circuit characteristic measurement options (224) are determined by the measurement capabilities of the test instrument and are presented to the user from which to select. For example, a multi-meter representation (222) includes circuit characteristic options (224) such as voltage, current, and resistance. Further, the circuit characteristic measurement options (224) include specifying the type of circuit characteristic measurement option, such as using alternating or direct voltage.

In one or more embodiments of the invention, the node selection options (226) are nodes the user may select to make the measurement across using the test instrument. Specifically, when two nodes are selected by the user, the test instrument measures a circuit characteristic across the two nodes. In one or more embodiments of the invention, the user may select two labeled nodes via the graphical user interface (200) to make the measurement. In one or more embodiments of the invention, the user selects a circuit element to measure across and the system determines the two nodes to be used for the measurement.

FIG. 2C shows an image of a breadboard system (101) as described above in FIG. 1. Specifically, FIG. 2C shows a breadboard (230) connected to a computing device (231), such as a laptop computer, in accordance with one or more embodiments of the invention. The breadboard (230) as shown in FIG. 2C includes nodes (232), an LED (234), which is illuminated in this image, and an LCD (236). One skilled in the art would appreciate that the image shown in FIG. 2C is for explanatory purposes only and is not intended to limit the scope of the invention.

FIGS. 3, 4, 5 and 6 show flowcharts in accordance with one or more embodiments of the invention. While the various steps in these flowcharts are presented and described sequentially, one of ordinary skill will appreciate that some or all of the steps may be executed in different orders, may be combined or omitted, and some or all of the steps may be executed in parallel. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention.

Figure 3:
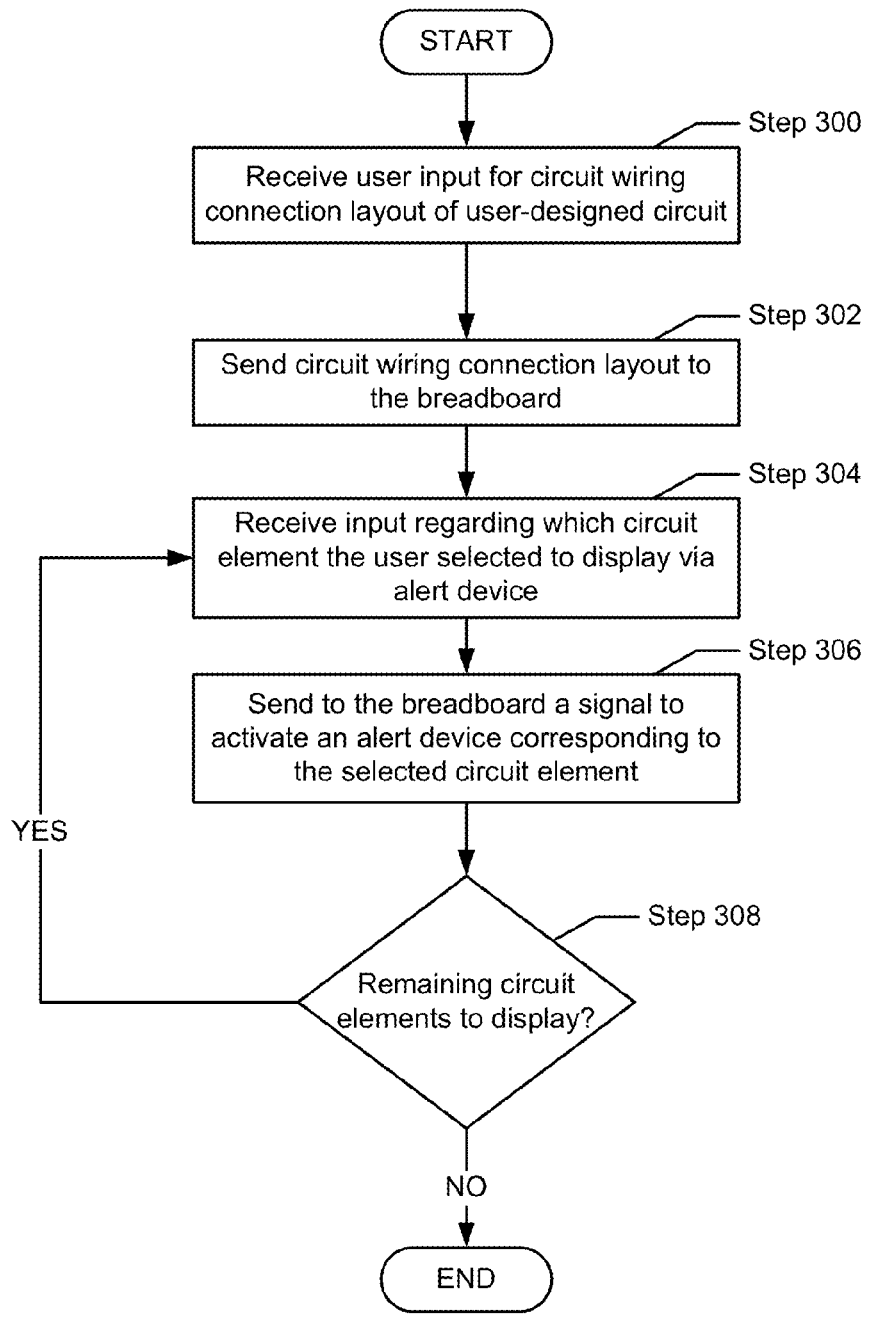
FIGS. 3, 4, 5, and 6 show flowcharts in accordance with one or more embodiments of the invention.

FIG. 3 shows a flowchart for a computing device setting up a circuit in accordance with one or more embodiments of the invention. Specifically, the computing device receives a user-drawn circuit to implement on the breadboard and configures the breadboard accordingly. In this figure, a single breadboard configuration is discussed; however, one skilled in the art would appreciate that the same flow could be applied to multiple configurations of computing device(s) and breadboard(s). The steps shown in FIG. 3 and described below may be performed on a computing system such as the one shown and described below in FIG. 8 that is specialized to set up circuits in accordance with one or more embodiments of the invention.

In Step 300, user input for a circuit wiring connection layout is received in accordance with one or more embodiments of the invention. In one or more embodiments, the input is received by the computing device from the user in a manner specified by and that is acceptable to the computing device. Specifically, the circuit wiring connection layout may be drawn by the user via a graphical user interface as shown in FIG. 2A. In one or more embodiments of the invention, the circuit wiring connection layout is drawn using a preexisting circuit drawing software application. Alternatively, the circuit wiring connection layout includes symbols for circuit elements and wire connections accordingly. In one or more embodiments of the invention, the circuit wiring connection layout is optimized by removing redundant circuit elements. In one or more embodiments of the invention, the circuit wiring connection layout must be completed (i.e., all terminals are connected and the circuit is connected to a power source and ground) in order to continue execution. Alternatively, an incomplete circuit (i.e., not all circuit elements are connected on the circuit wiring connection layout) is accepted by the user via the graphical user interface and execution continues. Further, the computing device may send a warning via the graphical user interface that connections and/or circuit elements are not present in the circuit wiring connection layout and that an error may occur. For example, if the circuit is a resistor and a capacitor connected in series, the circuit wiring connection layout includes the commonly accepted symbol for resistor and a user-drawn symbol for the capacitor connected by lines. Further, if the computing device determines that one terminal of the resistor is unconnected, a warning is displayed via the graphical user interface to connect the terminal.

In Step 302, the circuit wiring connection layout is sent to the breadboard in accordance with one or more embodiments of the invention. Specifically, the computing device formats the circuit wiring connection layout into a format to be used by the breadboard. In one or more embodiments of the invention, the computing device may parse the circuit wiring connection layout into connections by node or circuit element to send to the breadboard. For example, the computing device may send to the breadboard a table of nodes and corresponding circuit element terminals as defined by the circuit wiring connection layout. In one or embodiments, the circuit wiring connection layout is sent to the breadboard via a network connection. Further, acknowledgement of receipt is received by the computing device along with an identification of any errors.

In Step 304, user input about displaying a circuit element via the alert device is received in accordance with one or more embodiments of the invention. Specifically, the computing device uses user input to determine the alert device(s) to activate on the breadboard based on the selected circuit element. In one or more embodiments of the invention, multiple circuit elements are selected to be displayed via the alert device located on the breadboard. For example, if there is an LED connected to each node and the selected circuit element is a resistor connected to nodes 21 and 25, the computing device makes a determination to activate the LEDs associated with nodes 21 and 25 located on breadboard.

In Step 306, a signal activating a corresponding alert device is sent to the breadboard. Specifically, the computing device sends a signal to activate the appropriate alert device on the breadboard to help guide the user to place a circuit element. In one or more embodiments of the invention, the signal activates multiple different alert devices on potentially one or more breadboards. In one or more embodiments of the invention, the signal includes an alert device identifier for each alert device. Further, the signal includes the status of each alert device such as on/off for an LED. For example, once the computing device determines to activate a set of LEDs, the computing device sends the breadboard alert identifiers corresponding to the set of LEDs to activate along with the alert device status of "on."

In Step 308, a determination is made whether there are remaining circuit elements to display. Specifically, based on user input from the graphical user interface, the computing device determines whether all circuit elements are on the breadboard. In one or more embodiments of the invention, the computing device, based on the circuit elements selected for display via the graphical user interface, records the circuit elements placed on the breadboard. Alternatively, an incomplete circuit is accepted by the user via the graphical user interface and execution continues (i.e., not all circuit elements are connected on the breadboard). Further, the computing device sends an error warning via the graphical user interface that all circuit elements are not present on the breadboard and that an error may occur. For example, if the computing device determines that a resistor in the circuit wiring connection layout is not on the breadboard, the graphical user interface prompts the user to display and place the resistor on the appropriate breadboard. As long as there are remaining circuit elements, the process returns to Step 304.

Figure 4:
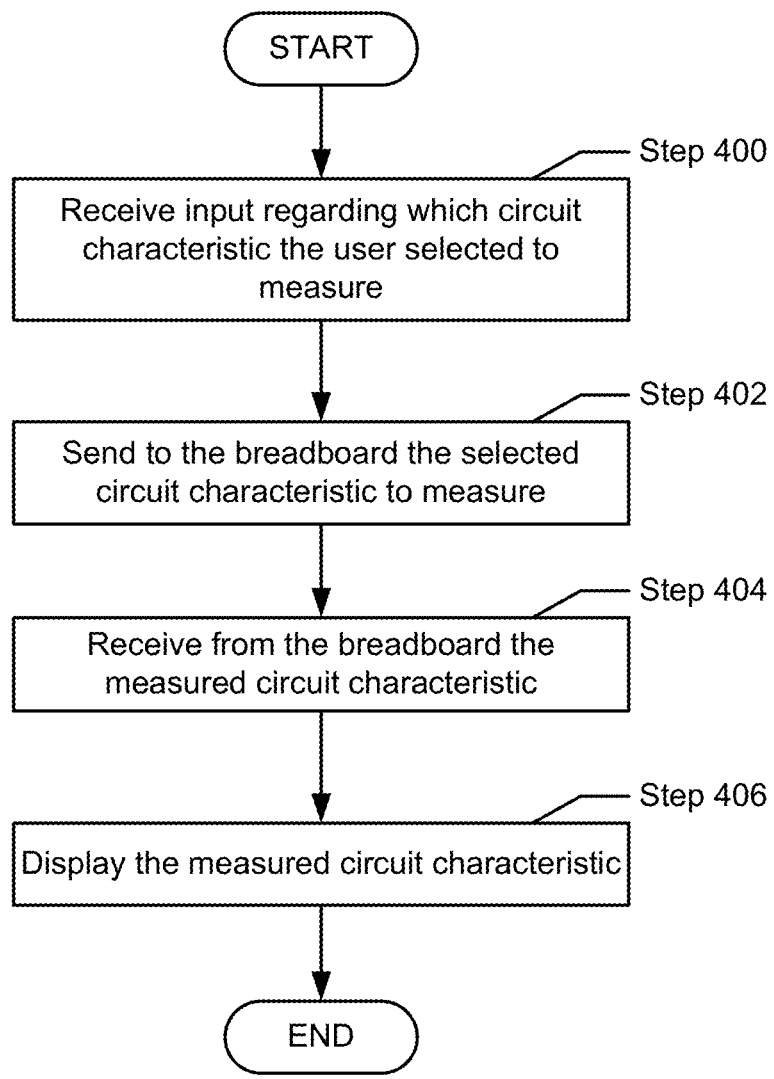

FIG. 4 shows a flowchart for a computing device initiating a test of the circuit and receiving the results in accordance with one or more embodiments of the invention. In this figure, a single breadboard configuration is discussed; however, one skilled in the art would appreciate that the same flow could be applied to multiple configurations of computing device(s) and breadboard(s). The steps shown in FIG. 4 and described below may be performed on a computing system such as the one shown and described below in FIG. 8 that is specialized to initiate a test of the circuit and receiving the results in accordance with one or more embodiments of the invention.

In Step 400, user input regarding which circuit characteristic to measure is received. Specifically, the computing device receives a selection of at least one test instrument and the parameters for each test instrument via the graphical user interface. In one or more embodiments of the invention, a power source is coupled with the test instrument and the computing device also receives parameters associated with the given power source. For example, if the user selects an oscilloscope and a function generator, the computing device receives the parameters of voltage measurements over 5 milliseconds for the oscilloscope as well as the parameters of a sinusoidal waveform with a frequency of 10 MHz for the function generator.

In one or more embodiments of the invention, the computing device receives circuit element placement information from the breadboard. Specifically, the computing device receives a snapshot of all nodes and the circuit elements connected to each. Based on the nodes that are connected, the computing device may determine whether a node is left unconnected and display an error warning message to the user. For example, if the breadboard sends a list of all nodes and the status of each node (i.e., connected to a circuit element or not), the computing device determines that a node is left unconnected and generates an error warning message on the graphical user interface that states a specific node is unconnected.

In one or more embodiments of the invention, the computing device receives an error code from the breadboard. Specifically, the computing device receives a predetermined error code, translates the error code, and displays it to the user. As described below in Step 506, the breadboard may generate error codes for impassable inaccuracies in the circuit. For example, if an error code that there is a faulty connection is received, the computing device may generate a message on the graphical user interface that states an error has occurred and that a faulty connection between two nodes is present.

In Step 402, the selected circuit characteristic to measure is sent to the breadboard in accordance with one or more embodiments of the invention. Specifically, the computing device formats the test instrument and power source configuration information into a format to be used by the breadboard. Further, the computing device also formats and sends information regarding the nodes on which to take the measurements. For example, the computing device may send two packets of data to the breadboard: (i) a packet with the test instrument configuration information and the specific nodes to test; and (ii) a packet with power source configuration information.

In Step 404, the measured circuit characteristic is received from the breadboard in accordance with one or more embodiments of the invention. Specifically, the computing device receives values measured for the particular circuit characteristic between the given nodes. In one or more embodiments of the invention, the measured circuit characteristic received is a one-time measurement. Alternatively, the measured circuit characteristic received is a stream of data. In one or more embodiments of the invention, the computing receives circuit characteristic measurements of any power sources in use. For example, if the test instrument is a multi-meter, the breadboard sends a one-time measurement of voltage. As another example, if the test instrument is an oscilloscope, the computing device receives a stream of data of voltage measurements over 5 milliseconds.

In one or more embodiments of the invention, the computing device determines an estimated circuit characteristic value and displays a warning to the user when the measured circuit characteristic is inconsistent in comparison to the estimated circuit characteristic value. Specifically, the computing device determines if the measured circuit characteristic is within a range of an expected value and displays a warning message accordingly. For example, if the estimated circuit characteristic is 0.5 mA and the measured circuit characteristic is 0.75 mA, the computing device displays a warning to the user that the measured circuit characteristic is outside of a 10% margin of error of the estimated circuit characteristic value.

In Step 406, the measured circuit characteristic is displayed in accordance with one or more embodiments of the invention. Specifically, the computing device displays the measured circuit characteristic via the graphical user interface. In one or more embodiments of the invention, the features displayed on the graphical user interface are determined by the test instrument used. Further, the features displayed are determined by whether a one-time measurement or a stream of data is received. In one or more embodiments of the invention, the measurements of power sources are also displayed to the user. For example, if the test instrument is an oscilloscope, the graphical user interface displays the measured voltage in relation to time. As another example, if the test instrument is a multi-meter, the graphical user interface displays the measured voltage on a scale of 0 to 100 Volts instead of in relation to time.

Once the computing device gathers and parses user input about the circuit, the parsed information is sent to the breadboard. With the user input and test parameters obtained by the breadboard, the breadboard physically makes connections between nodes and may make measurements between them. As a result, the breadboard uses information sent by the computing device to configure and test the circuit.

Figure 5:
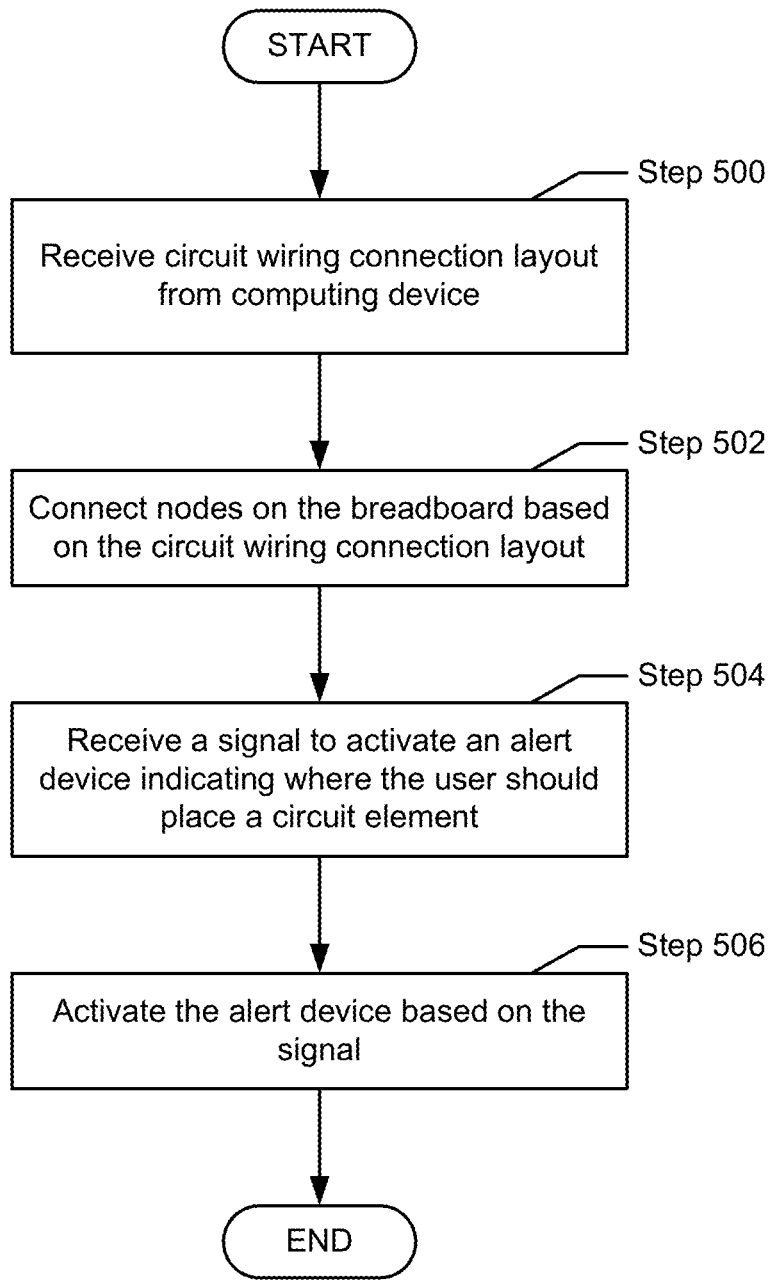

FIG. 5 shows a flowchart for setting up a circuit in accordance with one or more embodiments of the invention. Specifically, the breadboard receives configuration information about the circuit and sets up the physical hardware components of the breadboard accordingly. In this figure, a single breadboard configuration is discussed; however, one skilled in the art would appreciate that the same flow could be applied to multiple configurations of computing device(s), alert devices(s), and breadboard(s). The steps shown in FIG. 5 and described below may be performed on a computing system such as the one shown and described below in FIG. 8 that is specialized to set up a circuit in accordance with one or more embodiments of the invention.

In Step 500, a circuit wiring connection layout is received from the computing device in accordance with one or more embodiments of the invention in accordance with one or more embodiments of the invention. Specifically, the breadboard receives a circuit wiring connection layout across a network connection in a predetermined format, regardless of how the circuit wiring connection was initially created. In one or more embodiments of the invention, the received circuit wiring connection layout is structured into connections by node or circuit element. For example, if the circuit wiring connection layout included 5 nodes, the breadboard receives a packet for each of the 5 nodes including all circuit elements connected to a given node.

In Step 502, the nodes on the breadboard are connected based on the received circuit wiring connection layout in accordance with one or more embodiments of the invention. Specifically, the breadboard makes the connections between all circuit elements and power sources. In one or more embodiments of the invention, the connections are made using hardware, software, firmware, or a combination thereof. For example, if the positive terminal of a power source is connected to a resistor in the circuit wiring connection layout, the breadboard mechanically connects the positive terminal of the power source with the node connected to the resistor.

In Step 504, a signal activating a corresponding alert device is received from the computing device in accordance with one or more embodiments of the invention. Specifically, the breadboard receives a signal denoting the alert devices to activate in guiding the user to place a circuit element. In one or more embodiments of the invention, the signal activates multiple different alert devices. In one or more embodiments of the invention, the signal includes an alert device identifier for each alert device to activate. In one or more embodiments of the invention, the signal includes the status of each alert device. For example, the breadboard receives a set of alert device identifiers corresponding to the set of LEDs and a speaker to activate. Further, the breadboard receives a status of "on" for the corresponding LEDs and data to produce a sound wave for the speaker.

In Step 506, an alert device is activated based on the received signal in accordance with one or more embodiments of the invention. Specifically, the breadboard turns on alert devices corresponding to the signal sent by the computing device. In one or more embodiments of the invention, the breadboard uses the alert device identifiers sent in the signal to determine the alert devices to activate. Further, the breadboard uses the status of alert devices to activate alert devices accordingly. In one or more embodiments of the invention, the breadboard activates multiple alert devices simultaneously. For example, the breadboard turns on several LEDs and sends a signal to the speaker to produce a sound wave that directs the user to position the circuit element.

In one or more embodiments of the invention, the breadboard sends circuit element placement information to the computing device. Specifically, the breadboard sends a snapshot of nodes and the status of each node (i.e., connected to a circuit element or not). For example, the breadboard checks the status of each node and sends to the computing device a list of all nodes connected to a circuit element.

In one or more embodiments of the invention, the breadboard sends an error code to the computing device. Specifically, the breadboard checks the nodes and connections for defects and accordingly sends a predetermined error code to the computing device. In one or more embodiments of the invention, the breadboard detects faulty connections. In one or more embodiments of the invention, the breadboard also detects faulty alert devices. In one or more embodiments of the invention, the breadboard activates alert device(s) to alert the user of an error. For example, if the breadboard detects that an LED connected to a node is no longer functioning or is no longer connected, the breadboard sends a predetermined error code to the computing device. Further, the breadboard activates an LCD to display that a particular LED has burned out or is no longer connected.

Based on the activated alert device(s), the user physically inserts the corresponding circuit element into the breadboard (as shown in 230 of FIG. 2C). Specifically, when corresponding alert device(s) are activated to guide the user to place a selected element, the user places the correct terminals of the circuit element into the corresponding nodes. For example, the user selects a circuit element on graphical user device in FIG. 2A, the breadboard activates the alert devices and the user places the circuit element into the breadboard.

Figure 6:
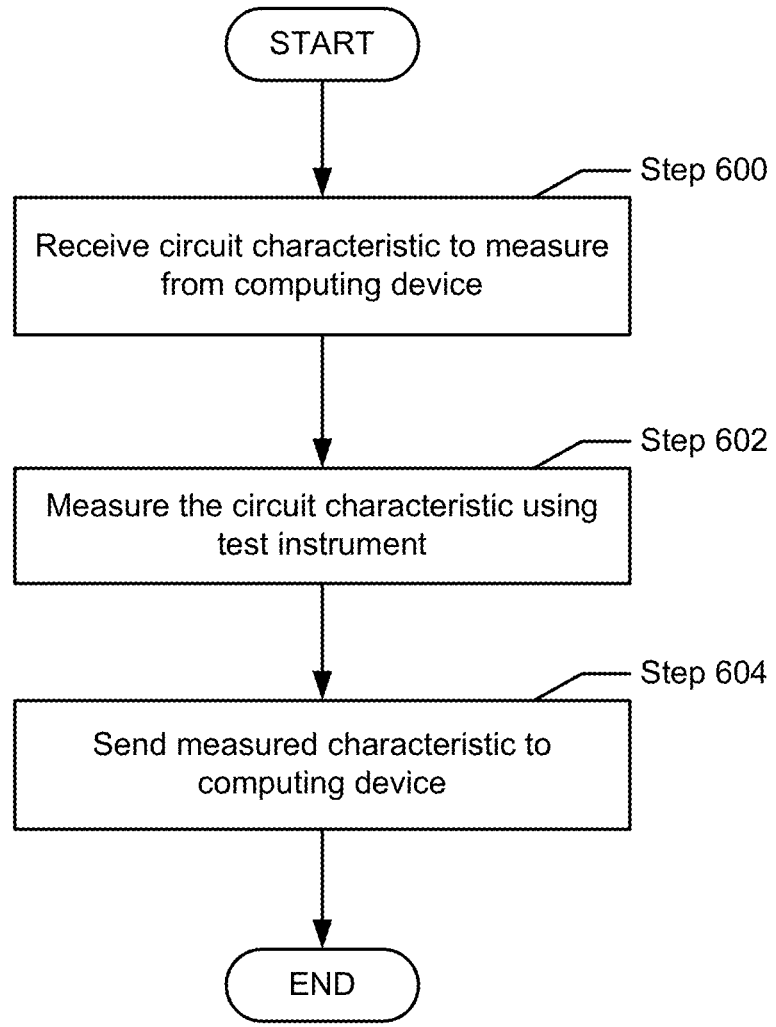

FIG. 6 shows a flowchart for a breadboard testing a circuit in accordance with one or more embodiments of the invention. In this figure, a single breadboard and test instrument configuration is discussed; however, one skilled in the art would appreciate that the same flow could be applied to multiple configurations of computing device(s), test instrument(s) and breadboard(s). The steps shown in FIG. 6 and described below may be performed on a computing system such as the one shown and described below in FIG. 8 that is specialized for a breadboard testing a circuit in accordance with one or more embodiments of the invention.

In Step 600, a circuit characteristic to measure is received from the computing device using a network connection in accordance with one or more embodiments of the invention. Specifically, the breadboard receives test instrument and power source configuration information. Further, the breadboard receives the nodes to measure across. In one or more embodiments of the invention, the configuration information includes the parameters to use both devices. For example, the breadboard may send two packets from the computing device: (i) a packet with test instrument configuration information; and (ii) a packet with power source configuration information.

In Step 602, the circuit characteristic is measured using the test instrument in accordance with one or more embodiments of the invention. Specifically, the breadboard configures the test instrument to measure the circuit characteristic using parameters defined by the user. In one or more embodiments of the invention, the breadboard also configures a power source to supply power to the circuit. For example, if the user defines parameters to measure voltage every nanosecond for 5 milliseconds using an oscilloscope, the breadboard sends a signal to the oscilloscope specifying configuration parameters and the time measurements are to start being taken.

In Step 604, the measured circuit characteristic is sent to the computing device in accordance with one or more embodiments of the invention. Specifically, the breadboard sends the values measured for the particular circuit characteristic. In one or more embodiments of the invention, the measured circuit characteristic is a one-time measurement. Alternatively, the measured circuit characteristic is a stream of data. In one or more embodiments of the invention, the breadboard sends measurements of any power sources in use. For example, if the test instrument is a multi-meter, the breadboard sends a one-time measurement of voltage to the computing device. As another example, if the test instrument is an oscilloscope, the breadboard sends a stream of data of voltage measurements over 5 milliseconds to the computing device.

FIGS. 7A, 7B, 7C, and 7D show an example in accordance with one or more embodiments of the invention. The following example is for explanatory purposes only and is not intended to limit the scope of the invention. For the following example, consider a scenario in which the user implements a circuit connecting a resistor and a diode in series on a breadboard system. In this example, the assumption is that the user-created circuit wiring connection layout drawn is without error. Similarly, the assumption is that all components and connections in the breadboard are connected and functioning properly.

Figure 7A:
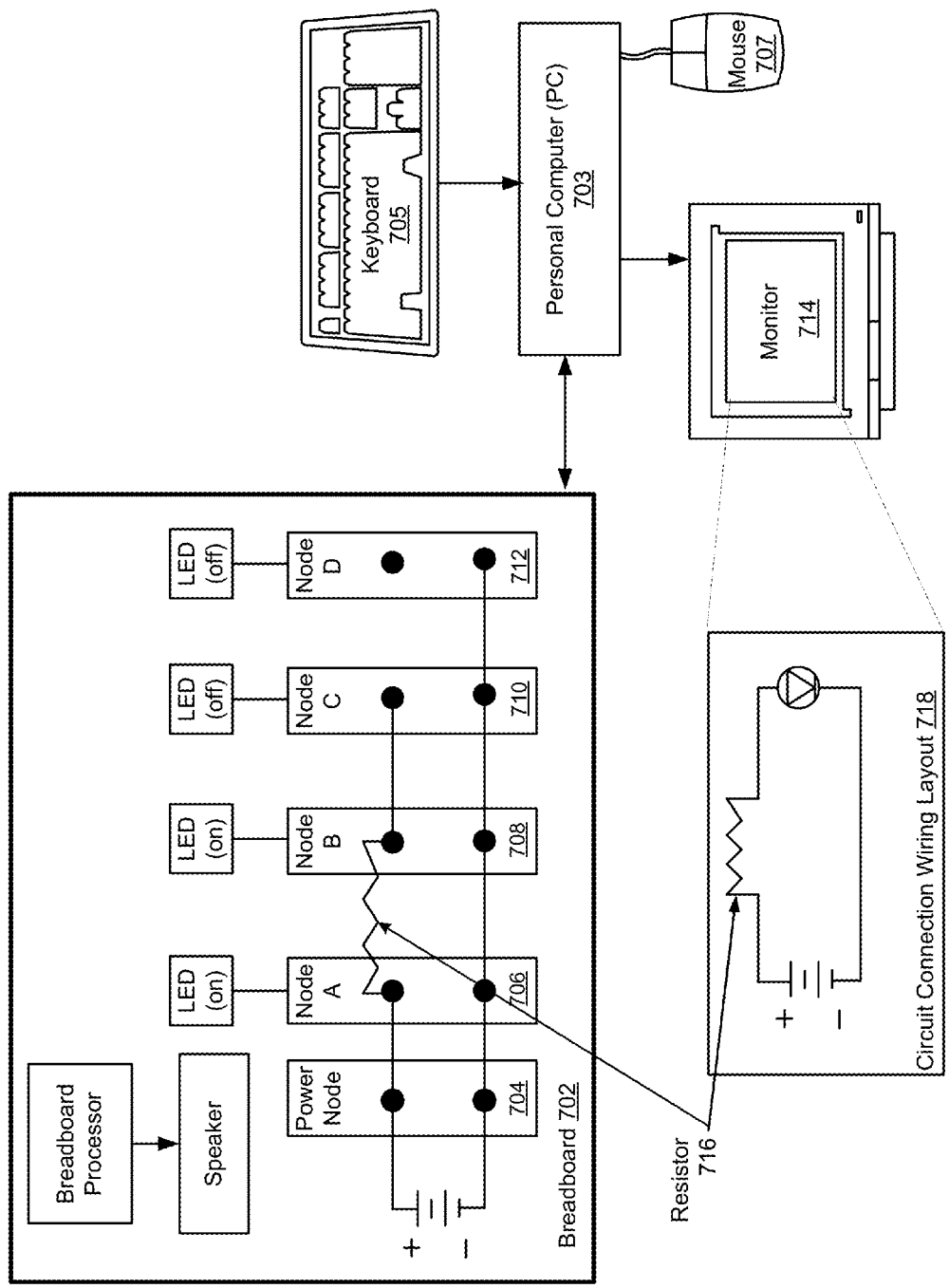

As shown in FIG. 7A, the breadboard (702) includes four nodes (Nodes A (706), Node B (708), Node C (710), and Node D (712)) and a power node (704) in accordance with one or more embodiments of the invention. Additionally, the breadboard (702) includes a speaker, an LED attached to each node, and an LCD (not shown). Further, FIG. 7A shows a PC (703), input devices such as a keyboard (705) and mouse (707) as well as a monitor (714) that is used to generate and display a graphical user interface for generating a circuit connection wiring layout (718) and selecting test instruments by the user and displaying measurements to the user. The PC (703) and component parts are similar to those described below in relation to FIG. 8. For example, consider the scenario in which the user selects, on the graphical user interface displayed on the monitor (714), to place the resistor (716) on the breadboard (702). The LEDs corresponding to Node A (706) and Node B (708), as denoted by the circuit wiring connection layout (718) to be the correct nodes to connect to, are turned on. Further, the speaker emits instructions such as "Please place one terminal of the 10K resistor into Node A and the other terminal into Node B." In response to the instructions, the user accordingly places the terminals of the resistor (716) into Node A (706) and Node B (708) on the breadboard (702).

As shown in FIG. 7B, another circuit element may be placed with instructions regarding orientation in accordance with one or more embodiments of the invention. In this example, the user selects, on the graphical user interface (shown on the monitor (720)), to display the position of the diode (722) on the breadboard (724). The LEDs corresponding to Node C (726) and Node D (728), as denoted by the circuit wiring connection layout (730) to be the correct nodes to connect to, are turned on. Further, the speaker emits instructions such as "Please place the positive terminal of the diode into Node C and the negative terminal into Node D." The LCD (732) also displays the orientation of the diode's terminals in relation to the nodes. In response to the instructions, the user accordingly places the respective terminals of the diode (722) into Node C (726) and Node D (728).

Figure 7C:
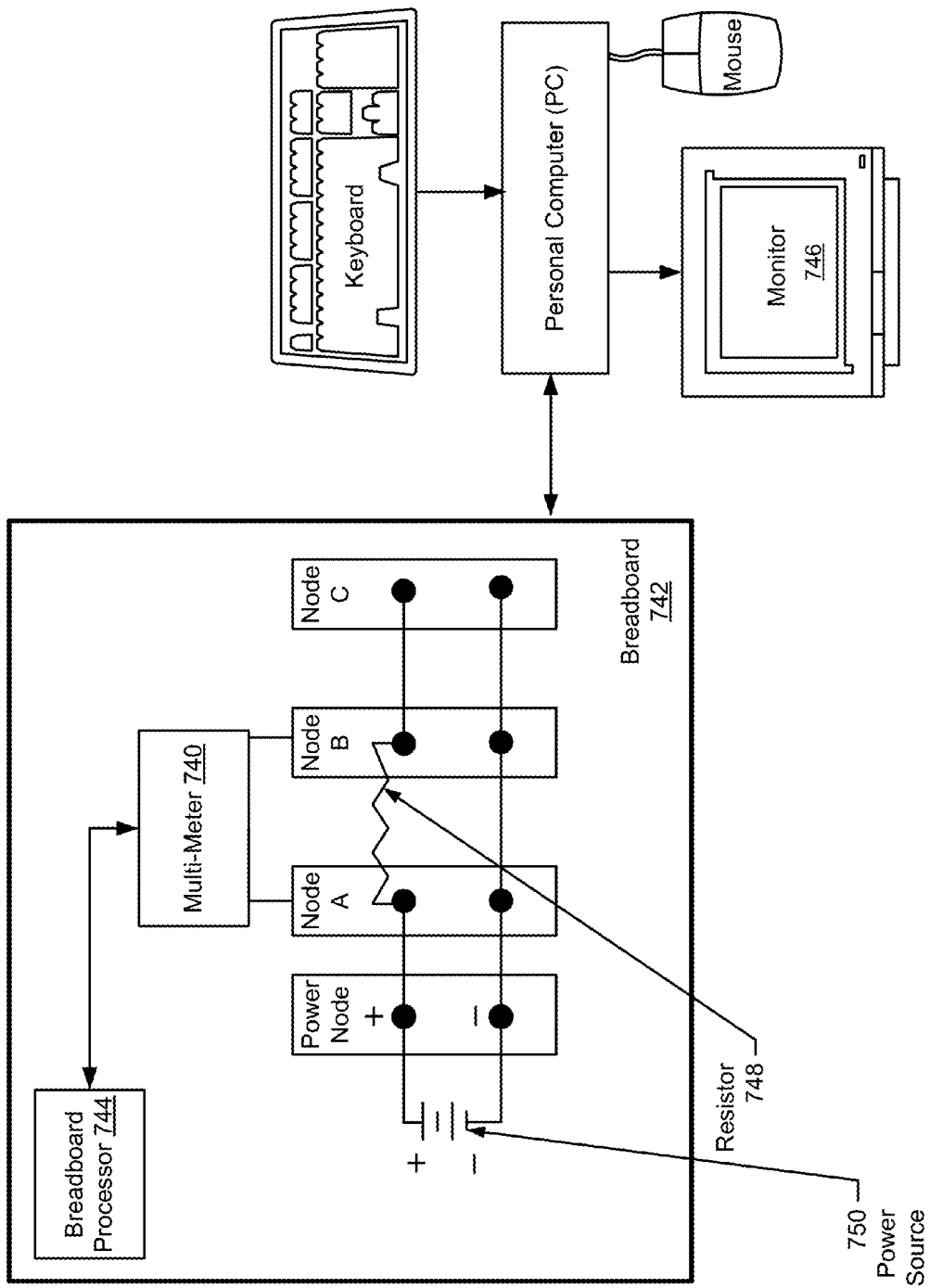

As shown in FIG. 7C, the circuit may be tested using a multi-meter (740) connected to the breadboard (742) and specifically the breadboard processor (744) in accordance with one or more embodiments of the invention. In this example, the user selects, on the graphical user interface (not shown) on the monitor (746), to test the voltage across the resistor (748) using a multi-meter (740). The user also selects to use a 5 volt battery as the power source (750). After hitting the "Test" button on the graphical user interface, a measurement is taken and a representation of the multi-meter (740) is displayed on the graphical user interface showing a reading of 5 volts.

Figure 7D:
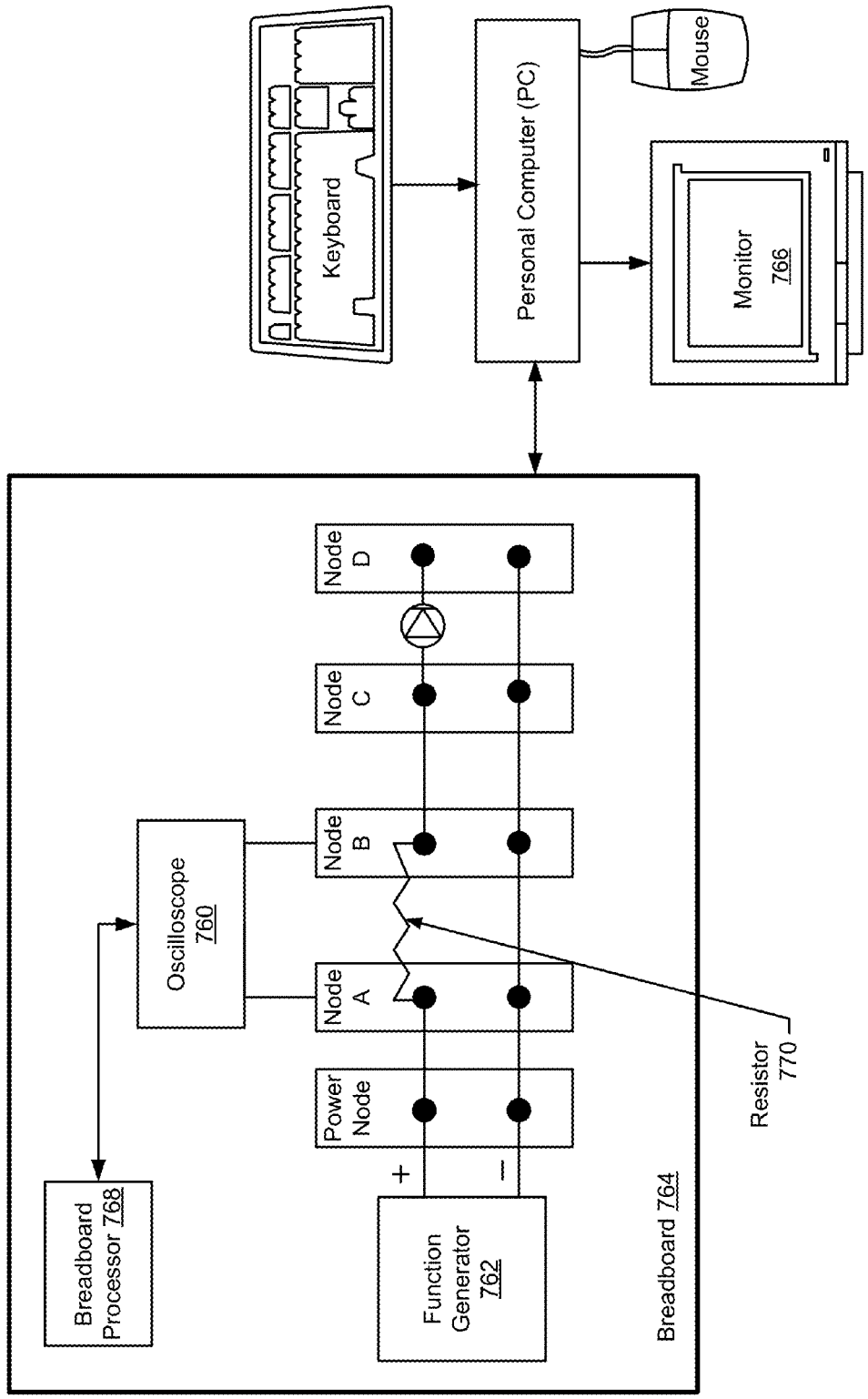

As shown in FIG. 7D, the circuit may be tested using an oscilloscope (760) and function generator (762) located on the breadboard (764) in accordance with one or more embodiments of the invention. Further, the oscilloscope (760) is connected to the breadboard processor (768). In this example the user selects, on the graphical user interface (not shown) on the monitor (766), to test the voltage across the resistor (770) using the oscilloscope (760). For the oscilloscope (760), the user selects (using the graphical user interface) taking a voltage measurement every microsecond for 5 milliseconds. The user also selects (using the graphical user interface) to use a function generator (762) as the power source. For the function generator (762), the user selects (using the graphical user interface) generating a 10 MHz sinusoidal waveform with an amplitude of 5 Volts. After hitting the "Test" button on the graphical user interface, a measurement is taken and the graph on the graphical user interface displays a function of voltage versus time. The user may select (using the graphical user interface) to auto-smooth the function on the oscilloscope (760) to obtain a clearer function.

Figure 8:
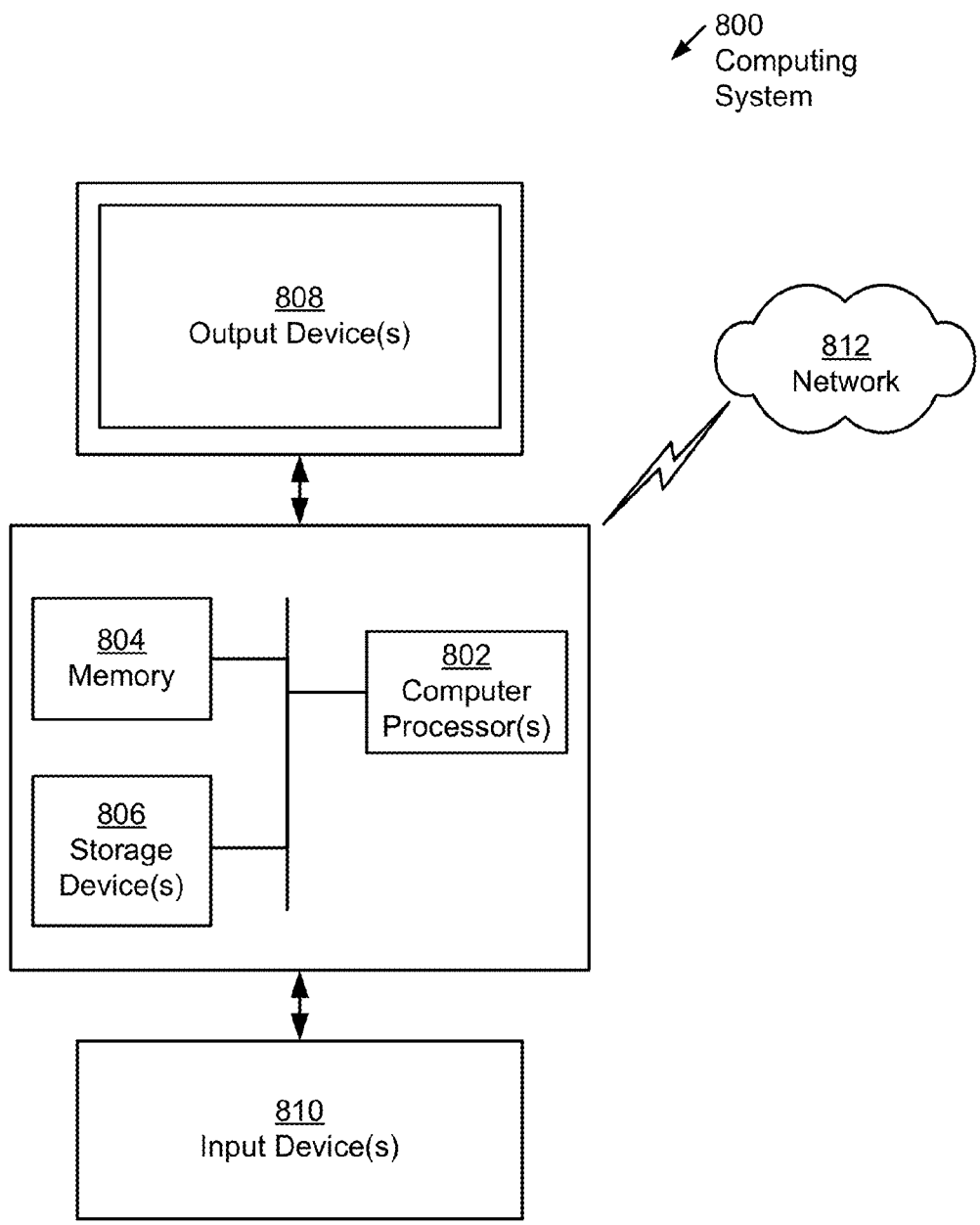
FIG. 8 shows a computer system in accordance with one or more embodiments of the invention.

Embodiments of the invention may be implemented on virtually any type of computing system regardless of the platform being used. For example, the computing system (800) may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention. For example, as shown in FIG. 8, the computing system (800) may include one or more computer processor(s) (802), associated memory (804) (e.g., random access memory (RAM), cache memory, flash memory, etc.), one or more storage device(s) (806) (e.g., a hard disk, an optical drive such as a compact disk (CD) drive or digital versatile disk (DVD) drive, a flash memory stick, etc.), and numerous other elements and functionalities. The computer processor(s) (802) may be an integrated circuit for processing instructions. For example, the computer processor(s) may be one or more cores, or micro-cores of a processor. The computing system (800) may also include one or more input device(s) (810), such as a touchscreen, keyboard, mouse, microphone, touchpad, electronic pen, or any other type of input device. Further, the computing system (800) may include one or more output device(s) (808), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (800) may be connected to a network (812) (e.g., a local area network (LAN), a wide area network (WAN) such as the Internet, mobile network, or any other type of network) via a network interface connection (not shown). The input and output device(s) may be locally or remotely (e.g., via the network (812)) connected to the computer processor(s) (802), memory (804), and storage device(s) (806). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (800) may be located at a remote location and connected to the other elements over a network (812). Further, embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or microcore of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for using a breadboard, comprising:
receiving a circuit wiring connection layout, wherein the circuit wiring connection layout comprises a visual representation of a plurality of circuit elements;
sending, to the breadboard, the circuit wiring connection layout;
receiving a selection of a circuit element from the plurality of circuit elements to obtain a selected circuit element;
sending, to the breadboard and based on the selected circuit element, a signal to activate an alert device on the breadboard indicating where a user should place the selected circuit element on the breadboard;
receiving a circuit characteristic to measure from the selected circuit element;
sending, to the breadboard, the circuit characteristic to measure from the selected circuit element;
receiving, from the breadboard, a measurement of the circuit characteristic to obtain a measured circuit characteristic; and
displaying the measured circuit characteristic.

2. The method of claim 1, further comprising:
receiving, from the breadboard, an error code; and
displaying the error code.

3. The method of claim 1, further comprising:
determining a placement of the circuit element; and
displaying, based on the placement of the circuit element, a warning.

4. The method of claim 1, further comprising:
determining an estimated circuit characteristic; and
displaying, based on the estimated circuit characteristic and the measured circuit characteristic, a warning.

5. The method of claim 1,
wherein the measurement is performed by a test instrument, and
wherein the test instrument is one selected from a group consisting of an oscilloscope, a multi-meter, and a function generator.

6. The method of claim 1, wherein the circuit characteristic is one selected from a group consisting of resistance, voltage, current, and capacitance.

7. The method of claim 1, wherein the alert device is at least one selected from a group consisting of a speaker, a plurality of Light Emitting Diodes (LEDs), and a Liquid Crystal Display (LCD).

8. The method of claim 1, wherein the plurality of circuit elements is one selected from a group consisting of a resistor, a capacitor, and an inductor.

9. A method for using a breadboard, comprising:
receiving a circuit wiring connection layout, wherein the circuit wiring connection layout comprises a visual representation of a plurality of circuit elements;
connecting, based on the circuit wiring connection layout, a plurality of nodes, wherein the breadboard comprises the plurality of nodes and an alert device connected to the plurality of nodes;
receiving a signal to activate the alert device indicating where a user should place a circuit element from the plurality of circuit elements on the breadboard;
activating, based on the signal, the alert device;
receiving a circuit characteristic to measure from the circuit element;
measuring, using a test instrument, the circuit characteristic from the circuit element to obtain a measured circuit characteristic; and
sending the measured circuit characteristic.

10. The method of claim 9, further comprising:
determining a placement of the circuit element; and
sending, based on the placement of the circuit element, an error code.

11. A system, comprising:
a breadboard comprising:
a plurality of nodes, and
an alert device connected to the plurality of nodes;
an output device and an input device; and
a computing device operatively connected to the output device and the input device, communicatively coupled to the breadboard, and comprising a device processor configured to:
receive a circuit wiring connection layout, wherein the circuit wiring connection layout comprises a visual representation of a plurality of circuit elements,
send, to the breadboard, the circuit wiring connection layout,
receive a selection of a circuit element from the plurality of circuit elements to obtain a selected circuit element,
send, to the breadboard and based on the selected circuit element, a signal to activate an alert device on the breadboard indicating where a user should place the selected circuit element on the breadboard,
receive a circuit characteristic to measure from the selected circuit element,
send, to the breadboard, the circuit characteristic to measure from the selected circuit element, receive, from the breadboard, a measurement of the circuit characteristic to obtain a measured circuit characteristic, and display the measured circuit characteristic.

12. The system of claim 11, wherein the device processor is further configured to:

receive, from the breadboard, an error code; and display the error code.

13. The system of claim 11, wherein the device processor is further configured to:

determine a placement of the circuit element; and display, based on the placement of the circuit element, a warning.

14. The system of claim 11, wherein the device processor is further configured to:

determine an estimated circuit characteristic; and display, based on the estimated circuit characteristic and the measured circuit characteristic, a warning.

15. The system of claim 11, wherein the breadboard further comprises a test instrument configured to measure the measured circuit characteristic.

16. The system of claim 15, wherein the breadboard further comprises a breadboard processor configured to:

receive, from the computing device, the circuit wiring connection layout;

connecting, based on the circuit wiring connection layout, the plurality of nodes;

receive, from the computing device, a signal to activate the alert device indicating where to place the circuit element from the plurality of circuit elements on the breadboard;

activate, based on the signal, the alert device;

receive, from the computing device, the circuit characteristic to measure from the circuit element;

measure, using a test instrument, the circuit characteristic from the circuit element to obtain the measured circuit characteristic; and send, to the computing device, the measured circuit characteristic.

17. The system of claim 16, wherein the test instrument is one selected from a group consisting of an oscilloscope, a multi-meter, and a function generator.

18. A non-transitory computer readable medium comprising instructions, which when executed perform a method, the method comprising:

receiving a circuit wiring connection layout, wherein the circuit wiring connection layout comprises a visual representation of a plurality of circuit elements;

sending, to the breadboard, the circuit wiring connection layout;

receiving a selection of a circuit element from the plurality of circuit elements to obtain a selected circuit element;

sending, to the breadboard and based on the selected circuit element, a signal to activate an alert device on the breadboard indicating where a user should place the selected circuit element on the breadboard;

receiving a circuit characteristic to measure from the selected circuit element;

sending, to the breadboard, the circuit characteristic to measure from the selected circuit element;

receiving, from the breadboard, a measurement of the circuit characteristic to obtain a measured circuit characteristic; and displaying the measured circuit characteristic.

19. The non-transitory computer readable medium of claim 18, wherein the alert device is at least one selected from a group consisting of a speaker, a plurality of Light Emitting Diodes (LEDs), and a Liquid Crystal Display (LCD).

20. The non-transitory computer readable medium of claim 18, wherein the plurality of circuit elements is at least one selected from a group consisting of a resistor, a capacitor, and an inductor.

* * * * *